United States Patent [19]

Olsen et al.

[11] 4,053,350

[45] Oct. 11, 1977

[54] METHODS OF DEFINING REGIONS OF CRYSTALLINE MATERIAL OF THE GROUP III-V COMPOUNDS

[75] Inventors: Gregory Hammond Olsen, Cranbury; Vladimir Sinisa Ban, Princeton, both of N.J.

[73] Assignee: RCA Corporation, New York, N.Y.

[21] Appl. No.: 595,289

[22] Filed: July 11, 1975

[51] Int. Cl.² .......................... C23F 1/02; B05D 5/12
[52] U.S. Cl. .................................. 156/659; 156/662; 156/904; 148/175; 148/187; 427/87; 427/122; 427/259
[58] Field of Search ............... 427/87, 259, 122, 86; 148/175, 187; 156/659, 662, DIG.904

[56] References Cited

U.S. PATENT DOCUMENTS

| 3,047,438 | 7/1962 | Marinace | 148/1.5 |
|---|---|---|---|
| 3,056,696 | 10/1962 | Browne | 427/259 X |
| 3,296,040 | 1/1967 | Wigton | 148/175 |
| 3,416,959 | 12/1968 | Cormia | 427/122 X |
| 3,421,055 | 1/1969 | Bean et al. | 317/234 |
| 3,451,867 | 6/1969 | Taft, Jr. et al. | 427/259 X |
| 3,484,313 | 12/1969 | Tauchi et al. | 148/187 |
| 3,511,702 | 5/1970 | Jackson, Jr. et al. | 156/612 |
| 3,802,967 | 4/1974 | Ladany et al. | 148/175 X |

OTHER PUBLICATIONS

V. Y. Doo, *IBM Technical Disclosures Bulletin*, vol. 9, No. 7, Dec. 1966, pp. 920-921.

*Primary Examiner*—Ronald H. Smith
*Assistant Examiner*—Evan K. Lawrence
*Attorney, Agent, or Firm*—G. H. Bruestle; D. S. Cohen

[57] ABSTRACT

A thin coating of carbon is used as a mask to define regions of a crystalline material of the group III-V compounds. A carbon mask is coated on portions of a surface of a substrate and the masked substrate contacted with the group III-V material to deposit the crystalline material only on the portions of the surface of the substrate not covered with the masking coating. The group III-V material will not be deposited on the carbon coating, since it is incapable of nucleating the growth of the crystalline material. Accordingly, a defined region of the crystalline material is formed. The carbon masking coating can also be used as a mask for etching cavities or recesses in a substrate of the group III-V material.

8 Claims, 6 Drawing Figures

METHODS OF DEFINING REGIONS OF CRYSTALLINE MATERIAL OF THE GROUP III-V COMPOUNDS

BACKGROUND OF THE INVENTION

1. Field of the Invention

The present invention relates to a method of defining regions of a group III-V compound and particularly to the use of a carbon coating as a mask for defining the regions of the material.

2. Description of the Prior Art

In making various types of devices of single crystalline or polycrystalline material, such as various types of semiconductor devices, optical or acoustical wave guides etc., it is often desirable to form defined regions of the crystalline material, e.g. to form spaced regions of the material on a substrate or to form regions of a particular shape and size on a substrate or to provide recesses or cavities in a body or layer of the material. One technique which has been used to form spaced or particularly shaped regions of a crystalline material on a substrate is to first form a layer of the crystalline material on the substrate, such as by epitaxial or pyrelytical deposition. A layer of a resist material is then provided on the surface of the portions of the crystalline material layer which are to be retained. The remaining portions of the crystalline material layer which are not covered by the resist are then removed, such as by etching. This technique has a problem in that in etching away the uncovered portions of the crystalline material layer it is difficult to control the depth of the etching to insure that all of the undesired crystalline material is removed but the substrate material is not removed. Also, the etching often undercuts the resist material so as to change the shape and size of the area of the crystalline material which is to remain. In addition, in this technique, the resist material is applied to the area of the crystalline material which is to remain and unless the resist material is completely removed it can contaminate the crystalline material.

Another technique which has been used to form spaced or particularly shaped regions of crystalline materials on a substrate is to apply a masking material on the surface of the substrate except where the crystalline material is to be provided. The single crystalline material is then deposited on the surface of the substrate not coated with the masking material and is not deposited on the masking material. The masking material is then removed leaving the defined regions of the crystalline material on the substrate. To carry out this technique the masking material must be of a material which will not nucleate the growth of the crystalline material so that the crystalline material will not deposit on the masking material. Also, the masking material must be capable of being removed without adversely affecting the deposited crystalline material. Silicon dioxide is the material which has heretofore generally been used as the masking material. Although silicon dioxide does not serve as a good nucleation site for the growth of the crystalline material, some of the material will deposit on the silicon dioxide. However, silicon dioxide is relatively porous so that in order to prevent the crystalline material from depositing on the substrate through the pores in the silicon dioxide a relatively thick coating of the silicon dioxide must be used. This makes the silicon dioxide masking layer harder to remove without adversely affecting the deposited single crystalline material.

SUMMARY OF THE INVENTION

A defined region of a group III-V crystalline material is formed on a substrate by first providing a thin coating of carbon on a surface of the substrate except where the crystalline material is to be provided. Then the crystalline material is deposited only on the portion of the surface of the substrate not covered by the carbon occurs on the carbon coating since it is incapable of nucleating the growth of the crystalline material.

DESCRIPTION OF THE PREFERRED EMBODIMENTS

Figure 1:
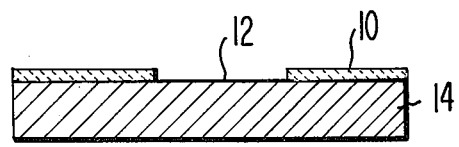
FIGS. 1-3 are sectional views illustrating various steps of the method of the present invention.

To form a defined region of a single crystal or a polycrystalline material of a group III-V compound on a surface of a substrate in accordance with the method of the present invention, a masking coating 10 of carbon is first coated on the surface 12 of the substrate 14 except where the defined region of the crystalline material is desired as illustrated in FIG. 1. The crystalline material to be deposited may be any one of the arsenides, phosphides, or nitrides of gallium, aluminum or indium and mixtures and alloys of such compounds. The substrate 14 may be of any material which will nucleate the growth of the crystalline material. For example, the substrate 14 may be a single crystal of a group III-V compound or of sapphire for the growth of a single crystal or polycrystalline material or may be a metal for the growth of polycrystalline material. The carbon masking coating 10 may be applied to the surface 12 of the substrate 14 by the well known technique of evaporation in a vacuum wherein carbon is vaporized in an evacuated chamber and the vapors are condensed on the surface 12 of the substrate 14. A mask is placed over the area of the surface 12 where the crystalline material is to be deposited so that the carbon masking coating 10 is coated only on the portions of the surface 12 which are not to be coated with the crystalline material. Although the carbon masking coating 10 may be of any thickness, it can be as thin as 2 Angstroms and still satisfactorily perform its masking function.

Figure 2:
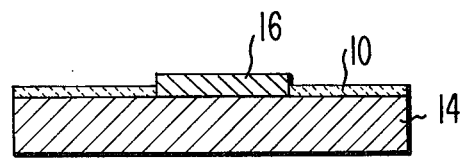

A layer 16 of the group III-V crystalline material is then deposited on the portion of the surface 12 of the substrate 14 not covered by the carbon masking coating 10 as illustrated in FIG. 2. A single crystalline material layer 16 may be deposited on the substrate 14 by any well-known epitaxial deposition technique. For example, the single crystalline material layer 16 may be deposited by the well-known technique of vapor phase epitaxy wherein the exposed surface of the masked substrate 14 is contacted by a gas or vapor containing the elements of the single crystalline material, which gas or vapor is passed over the substrate 14 and heated to cause a reaction which deposits a layer of the group III-V material on the exposed surface of the substrate 14. One such vapor phase epitaxial process is described in the article of J. J. Tietjen and J. A. Amick entitled "The Preparation and Properties of Vapor-Deposited Epitaxial $GaAs_{1-x}P_x$ using Arsine and Phosphine", JOURNAL ELECTRO-CHEMICAL SOCIETY, Vol. 113, page 724, 1966. Another vapor phase epitaxial process is the organo-metallic process described in U.S. Pat. No. 3,802,967 of I. Ladany et al, issued Apr. 9, 1974, entitled "III-V Compound on Insulating Substrate and Its Preparation and Use". The single crystalline material layer 16 can also be deposited by the well-known technique of liquid phase epitaxy wherein the exposed surface of the substrate 14 is brought into contract with a heated solution of the material in a solvent and the solution is cooled to percipitate out the material which deposits on the exposed surface of the substrate 14. This process is described in the article of H. Nelson, entitled "Epitaxial Growth From The Liquid State and Its Application To The Fabrication of Tunnel and Laser Diodes", RCA Review 24, page 603, 1963, and in U.S. Pat. No. 3,753,802 to H. F. Lockwood et al. issued Aug. 21, 1973, entitled "Method of Depositing Epitaxial Semiconductor Layers From The Liquid Phase". A polycrystalline layer 16 may be deposited by any well-known vapor deposition technique. No matter whether the crystalline layer 16 of the group III-V compound is deposited by vapor phase epitaxy, liquid phase epitaxy or vapor deposition, the crystalline material will not deposit on the carbon masking coating 10 or through the carbon masking coating 10 onto the covered surface of the substrate 14 even though the carbon masking coating 10 may be as thin as 2 Angstroms. Thus, the carbon masking coating 10 limits the deposition of the crystalline group III-V material to the uncovered portion of the surface 12 of the substrate 14.

Figure 3:
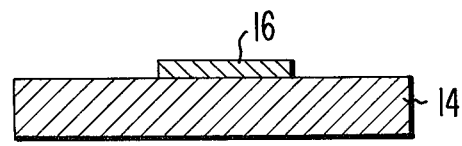

The carbon masking coating 10 is then removed leaving the defined region of the crystalline group III-V compound 16 on the substrate 14 as illustrated in FIG. 3. The carbon masking coating 10 may be removed by either of the well-known techniques of sputter etching or glow discharge etching. Since the carbon masking coating 10 is very think it can be easily and quickly removed without adversely affecting the crystalline layer 16.

Figure 4:
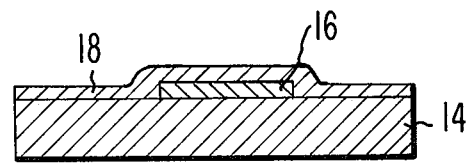
FIG. 4 is a sectional view illustrating a further step which can be used in the method of the present invention.
Figure 5:
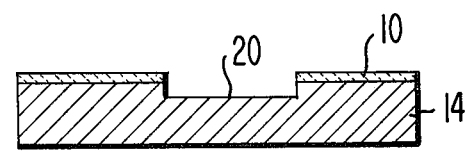
FIGS. 5 and 6 are sectional views illustrating other additional steps which can be used in the method of the present invention.
Figure 6:
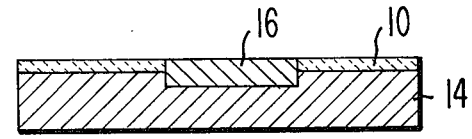

FIG. 4 illustrates a further step which can be carried out in the method of the present invention. After the carbon masking coating 10 is removed, a second crystalline layer 18 is deposited on the defined region 16 and the portion of the surface of the substrate 14 which had been previously covered by the masking coating 10. Thus, the defined region 16 of the crystalline material becomes completely surrounded by the substrate 14 and the second crystalline layer 18. By making the defined region 16 of a group III-V having an index of refraction different from that of the materials of the substrate and the second single crystalline layer 18, the resultant device can be an optical waveguide. Alternatively, by incorporating in two single crystalline layers 16 and 18 conductivity modifiers of different conductivity types, a pn junction will be formed between the two layers to form a semiconductor device, such as a diode, laser etc. If the second single crystalline layer is deposited prior to removing the carbon masking coating 10, the second single crystalline layer will deposit only on the first single crystalline layer 16 so as to provide a defined region having multiple layers. If the multiple layers are of different conductivity types, there can be formed various types of semiconductor devices. FIGS. 5 and 6 show still other steps which can be performed with the method of the present invention. After the carbon masking coating 10 is provided on portions of the surface 12 of the substrate 14 as illustrated in FIG. 1, the uncovered portion of the surface 12 is etched away to form a recess 20 in the substrate 14 as illustrated in FIG. 5. If the substrate 14 is of a crystalline group III-V compound, the substrate 14 can be etched with Caro's acid which will not attack the carbon masking coating 10. However, other etchants which will not attack the carbon masking coating 10 can also be used. The layer 16 of the crystalline group III-V compound is then deposited on the uncovered portion of the substrate 14 in the recess 20. This provides a pocket of the crystalline group III-V compound in the substrate. Additional layers of crystalline material can then be deposited over the layer 16 as previously described with regard to FIG. 4.

We claim:

1. A method of forming a defined region of a group III-V crystalline material on a substrate of nucleating the growth of said material comprising the steps of:

providing a thin masking coating of carbon on a surface of the substrate except where the defined region of crystalline material is to be provided, said carbon coating being incapable of nucleating the growth of said crystalline material, and contacting the masked substrate with the crystalline material to deposit a first layer of crystalline material thereon, whereby said material is not deposited on the carbon coating but only on the surface of the substrate which is not covered by said coating.

2. The method in accordance with claim 1 in which after the first layer of crystalline material is deposited on the substrate the carbon masking coating is removed.

3. The method in accordance with claim 2 in which the carbon masking coating is removed by sputtering.

4. The method in accordance with claim 1 in which the carbon masking coating is provided on the surface of the substrate by vaporizing the carbon in a vacuum and condensing the vapors on the surface of the substrate while masking the portion of the surface where the crystalline region is to be provided.

5. The method in accordance with claim 1 including depositing a second layer of said crystalline material on the first layer of crystalline material.

6. The method in accordance with claim 5 in which prior to depositing the second layer of crystalline material the carbon masking coating is removed and the second layer is deposited on the first layer of crystalline material and the portions of the surface of the substrate from which the carbon masking coating was removed.

7. The method in accordance with claim 1 in which prior to depositing the first layer of crystalline material a portion of the substrate at the surface not covered by the masking coating is removed to form a recess and the crystalline material is deposited in the recess.

8. The method in accordance with claim 7 in which the portion of said substrate portion is removed by etching with an etchant that does not attack the carbon masking coating.

* * * * *

UNITED STATES PATENT OFFICE
CERTIFICATE OF CORRECTION

PATENT NO. : 4,053,350
DATED : October 11, 1977
INVENTOR(S) : Gregory Hammond Olsen; Vladimir Sinisa Ban It is certified that error appears in the above-identified patent and that said Letters Patent are hereby corrected as shown below:

Column 2, line 10, after "carbon" insert --coating. No deposition--

Signed and Sealed this

Twenty-eighth Day of March 1978

[SEAL]

Attest:

RUTH C. MASON
Attesting Officer

LUTRELLE F. PARKER
Acting Commissioner of Patents and Trademarks